US006005186A

United States Patent [19]

Bachman

[11] Patent Number: 6,005,186

[45] Date of Patent: Dec. 21, 1999

[54] SNAP-FIT ELECTROMAGNETIC SHIELD

[75] Inventor: Wesley H. Bachman, Rochester, Minn.

[73] Assignee: International Business Machines Corporation, Armonk, N.Y.

[21] Appl. No.: 09/049,445

[22] Filed: Mar. 27, 1998

[51] Int. Cl.[6] .......... H05K 9/00

[52] U.S. Cl. .......... 174/35 R; 174/35 GC; 174/35 C; 439/939

[58] Field of Search .......... 174/35 GC, 35 R, 174/35 C, 35 MS; 24/293; 361/816, 818; 439/607, 939, 610

[56] References Cited

U.S. PATENT DOCUMENTS

| | | | |
|---|---|---|---|
| 4,659,163 | 4/1987 | Althouse et al. | 339/143 R |
| 5,500,788 | 3/1996 | Longueville et al. | 361/800 |
| 5,600,092 | 2/1997 | Patscheck et al. | 174/35 GC |
| 5,652,410 | 7/1997 | Hobbs et al. | 174/35 GC |
| 5,865,646 | 2/1999 | Ortega et al. | 439/607 |

OTHER PUBLICATIONS

Instrument Specialties, *Product Design & Shielding Selection Guide*, Sep. 1994, cover pages and pp. 74–75, 77.

*Primary Examiner*—Kristine Kincaid
*Assistant Examiner*—Ronnie Mancho
*Attorney, Agent, or Firm*—Dugan & Dugan

[57] ABSTRACT

A snap-fit shield is provided which fits securely within a frame opening, and which shields and grounds the opening while allowing cables to pass therethrough. The shield has a plurality of front extensions, a plurality of front flanges and a plurality of back extensions. The shield is designed to fit tightly within the frame opening, such that the back extensions contact an internal cage and thereby bias the shield forward toward the frame. An outward biasing mechanism is provided to contact the inner surface of the frame opening so as to limit the shield's forward movement. The combined action of the backward extensions and the outward biasing mechanism limits both the shield's forward and backward movement. The front flanges may be used to indicate proper shield positioning, and the front extensions are preferably easily deflected to facilitate shield insertion and removal.

23 Claims, 5 Drawing Sheets

SNAP-FIT ELECTROMAGNETIC SHIELD

BACKGROUND OF THE INVENTION

The present invention relates to the shielding of electromagnetic radiation in order to minimize electromagnetic coupling, and to the prevention of electrostatic discharge. More specifically, the present invention provides improved shielding and grounding of the openings in shielded equipment cages, e.g., in computer equipment, telecommunications equipment, and the like.

Two problems that have long plagued electrical equipment designers are electromagnetic coupling (EMC) and electrostatic discharge (ESD). EMC is the unintentional transfer of electromagnetic radiation from one or more electrical components to another electrical component. EMC produces undesirable noise in and/or interferes with the normal operation of the receiving electrical component. EMC can occur any time an electrical component is located within an electromagnetic radiation rich environment, such as proximate other electrical components. To prevent EMC, a system of electrical components, e.g., the various interconnected circuit boards of a computer, is often contained within a metal cage, e.g., a processor cage, that blocks out, i.e., "shields" the system from most electromagnetic radiation existing outside the metal cage, and that likewise prevents electromagnetic radiation produced within the cage from affecting equipment external to the cage.

ESD is the discharge of static electrical charge that occurs when two objects having different static charge states, e.g., different amounts of charge, opposite polarity charge, etc., are closely proximate. Because ESD can result in large, although short duration, voltages which can interfere with the operation of or damage electrical devices, ESD must be avoided whenever possible. To prevent static charge buildup that can cause ESD, the cage, electrical components therewithin, and any connections thereto share the same ground, i.e., are commonly grounded. For instance, a computer may have a processor cage shielding the computer's main circuit boards, and a frame surrounding and supporting a hard drive, power supply, the processor cage, etc. To prevent ESD between the frame and processor cage, the frame and processor cage should be commonly grounded whenever a connection is made therebetween.

While a properly grounded cage may protect electrical circuitry within the cage from EMC and ESD, often the electrical circuitry within the cage must connect to external circuitry/equipment. To allow for such connections, openings are provided in the cage. These openings form an EMC path into the cage, and if not properly grounded, form a conduit or "situs" for ESD.

One approach for reducing EMC and ESD through a shielded cage opening is to plug the opening with a shielded plug. For instance, U.S. Pat. No. 5,600,092 to Patscheck et al. ("the '092 Patent") shows a single contact spring that removably fills an opening of a shielded cage when no cables connect to or through the cage opening. The '092 Patent, however, does not address EMC shielding or ESD protection when the contact spring is removed from the cage opening, such as when a cable extends therethrough. EMC protection is required both when the external connection is present and when it is absent, and continuous grounding is needed to continuously prevent ESD.

Another approach for reducing EMC and ESD through an opening in a shielded cage is to commonly shield, i.e., within a single cage, the opening as well as any external electrical components coupled via the opening, see, for example, U.S. Pat. No. 5,652,410 to Hobbs et al. However, for large external components, e.g., computers, printers, etc., shielding is often impractical and does not prevent EMC between the caged components and the commonly shielded components. That is, EMC protection is provided only from radiation sources external to both the cage and the commonly shielded electrical components.

Yet another shielding method mounts a shield having a central aperture such as those manufactured by Instrument Shielding Specialties within an opening. In order to hold the shield securely in place and thus to avoid the inconsistent shielding caused by shield movement, central aperture type shields are often adhesively mounted or mounted mechanically via screws or the like. Shield mounting thereby becomes time consuming, slows equipment assembly and teardown, and is unacceptable for many applications.

Accordingly, a need exists for a method and apparatus for shielding cage openings whether or not the openings are in use, without requiring the shielding of equipment or components external to the cage. The shield must be mechanically stable to ensure a continuous grounding and shielding, and must be designed to facilitate assembly and teardown.

SUMMARY OF THE INVENTION

The present invention provides a snap-in shield for preventing EMC through a frame opening and/or for providing a ground path between the frame and a cage such as a processor cage or other shielded equipment cage. The snap-in shield has an outer shell which surrounds a central aperture through which a cable may pass. The shield is configured such that when in position within the frame opening the shield is biased against both the frame and the cage, i.e., is snap-fit within the opening. The snap-fit design holds the shield securely between the frame and the cage, providing stable and continuous grounding and/or shielding between the frame opening and a cage opening aligned therewith. Thus, whether or not a cable occupies the cage opening, the circuitry internal to the cage is shielded from radiation sources external to the frame. Moreover, the snap-fit design allows the shield to be easily installed and removed.

The shield comprises a conductive shell having a front perimeter and a back perimeter. As used herein the shell's "front" perimeter refers to the perimeter nearest the frame when the shell is inserted within the frame opening, and the shell's "back" perimeter refers to the perimeter nearest the cage when the shell is inserted within the frame opening. The shield's material and thickness are selected such that the shield deflects easily when force is exerted thereon.

A plurality of front extensions and a plurality of front flanges extend from the shell's front perimeter, and a plurality of back extensions extend from the shell's back perimeter. The back extensions are dimensioned to compress against the cage when the shield is snap-fit within the frame, and one or more outwardly biased portions, which may be located on any portion of the shield, are designed to exert force on an inner surface of the frame when the shield is snap-fit therein. To facilitate compression the back extensions are preferably curved.

The back extensions force the shield away from the cage, i.e., forward, until the outwardly biased portions contact the frame's inner surface. The back extensions thus limit the shield's backward movement, and the outwardly biased portions limit the shield's forward movement so that the shield is securely held in place within the frame opening. In this manner, the snap-in shield provides continuous shielding and grounding between the frame opening and the cage. Circuitry contained behind the cage, e.g., within a processor cage, is protected from EMC and ESD regardless of the presence or absence of a cable passing through the inventive shield.

To install and/or remove the shield the front extensions are manually deflected inward so that the outwardly biased portions clear the perimeter of the frame opening. The shield is then placed into or pulled out of the frame opening.

The outward biases may be positioned on the shell, and the shield designed such that sufficient inward deflection of the front extensions causes the shell to deflect inwardly, enabling the outward biases to clear the perimeter of the frame opening. The shield then may be placed into or pulled out of the frame opening. However, preferably, to facilitate deflection of the front flanges a plurality of notches or cut-out regions are positioned adjacent the front extensions and extend into the shell, thus forming a plurality of elongated front extensions. By locating the outwardly biased portions on the elongated front extensions, the outwardly biased portions are more easily moved into and out of contact with the frame. Thus, the inventive shield's snap-fit design not only provides a superior EMC shield that shields and grounds continuously regardless of cable presence or absence, but also enables easy installation and teardown.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 1:
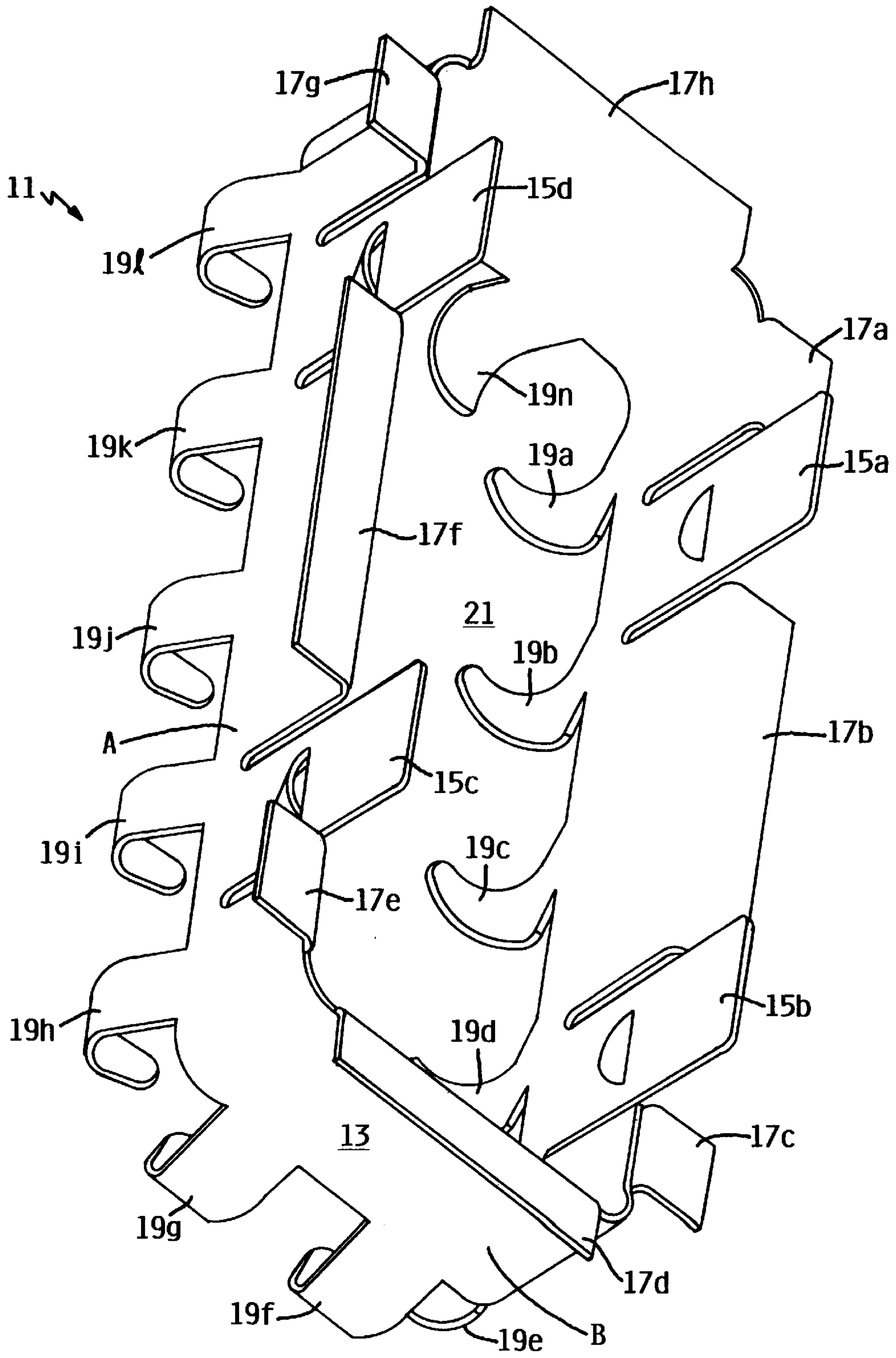
FIG. 1 is a front perspective view of a preferred shield configuration.
Figure 2:
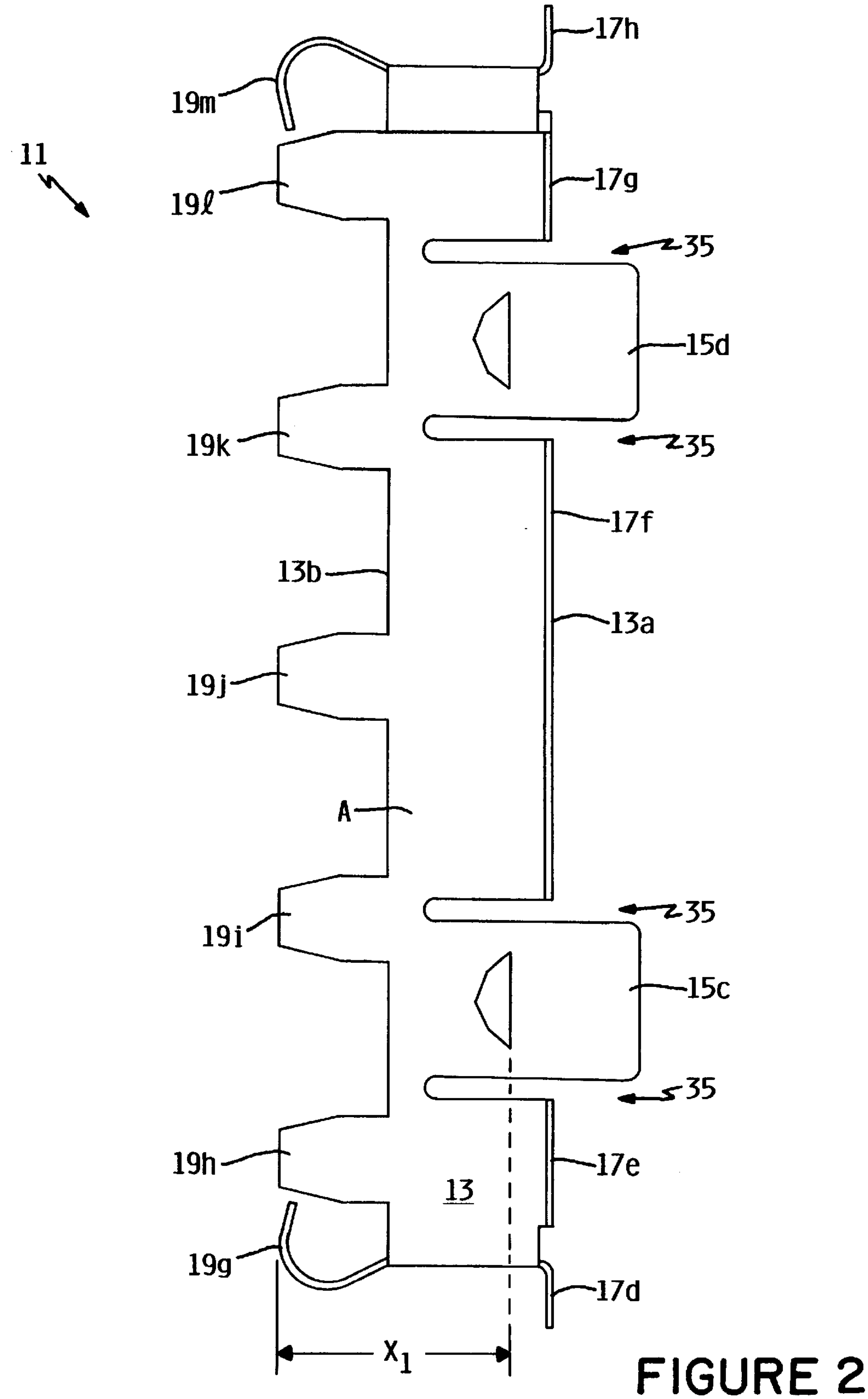
FIG. 2 is a side plan view of the inventive shield of FIG. 1 taken along side A.

FIG. 1 is a front perspective view of an inventive shield 11, and FIG. 2 is a side plan view of the inventive shield 11 taken along side A of FIG. 1. As shown in FIGS. 1 and 2 the shield 11 comprises a conductive shell 13 having a front perimeter 13*a* (FIG. 2) and a back perimeter 13*b* (FIG. 2). A plurality of front extensions 15*a–d* and a plurality of front flanges 17*a–h* extend from the front perimeter 13*a*, and a plurality of back extensions 19*a–n* extend from the back perimeter 13*b*. The front flanges 17*a–h* are bent so as to extend away from a central aperture 21 of the shield 11, i.e., so as to extend radially outward from the shell 13, and thus limit the depth to which the shield 11 may be inserted in an opening. The front flanges 17*a–h* therefore indicate when the shield 11 has been inserted to an appropriate depth.

Figure 3:
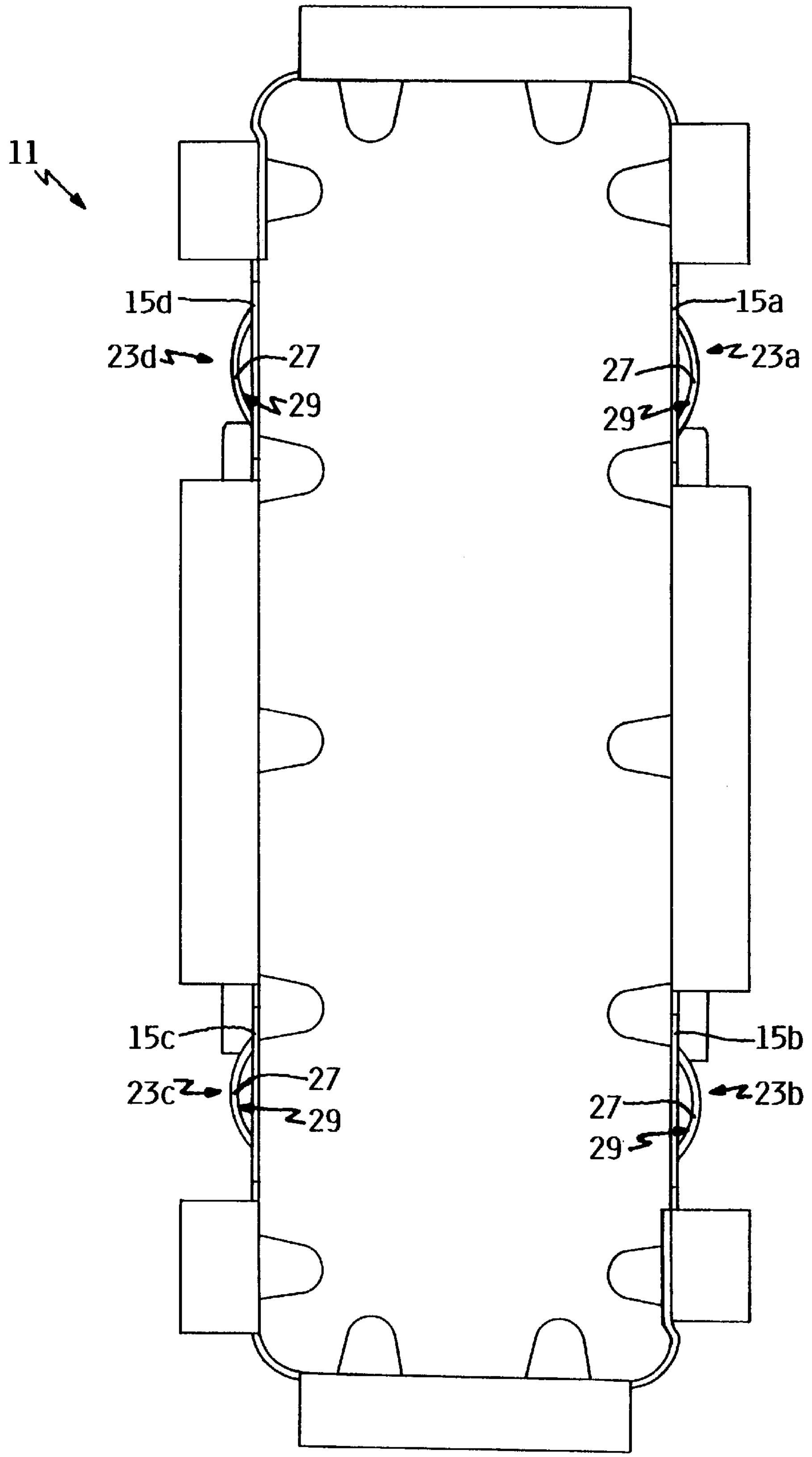
FIG. 3 is a top plan view of the inventive shield of FIG. 1.
Figure 4:
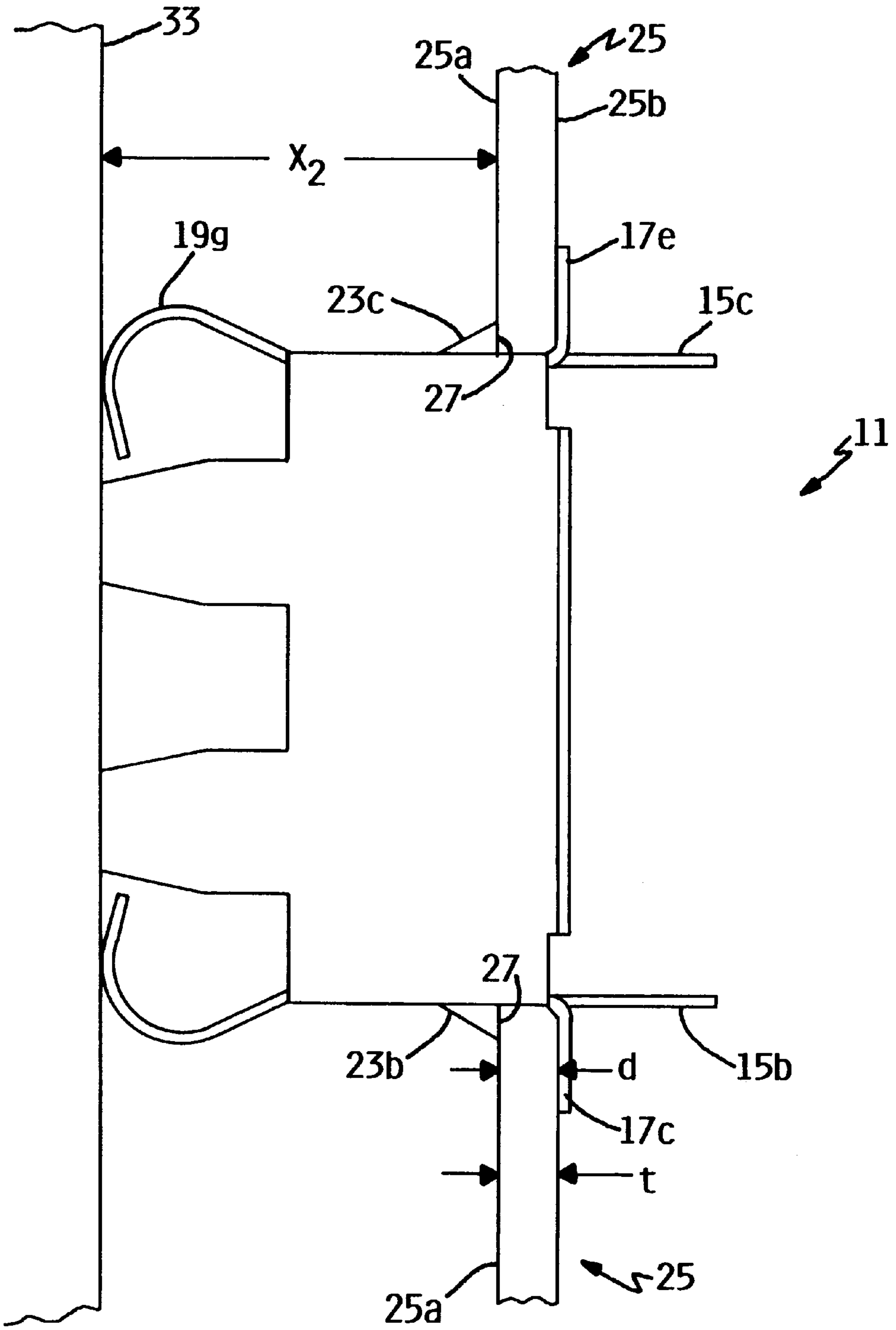
FIG. 4 is a side plan view of the inventive shield of FIG. 1 taken along side B, showing the shield in position within a frame opening.

As best seen with reference to the top plan view of FIG. 3 and the side plan view (taken along side B of FIG. 1) of FIG. 4, the shield 11 also comprises one or more outward biases, e.g., the outward biases 23*a–d* of FIGS. 3 and 4, for biasing the shield 11 against an inner surface 25*a* of a frame 25 (FIG. 4) in which the shield 11 is mounted. Preferably each front extension 15 has one outward bias 23 located thereon. The outward biases 23*a–d* each comprise a lance 27, the backside 29 of which, is bowed outward to contact the frame 25. The outward biases 23*a–d* thus prevent the shield 11 from inadvertently slipping out of its position within frame 25. In order to maintain the shield 11 firmly in place, the lance 27 is positioned parallel to an inner surface 25*a* of the frame 25 and such that a distance, represented by the letter "d" on FIG. 4, between the front flanges 17, e.g., front flange 17*c*, and the lance 27 is approximately equal to the frame thickness, represented by the letter "t" on FIG. 4.

Figure 5:
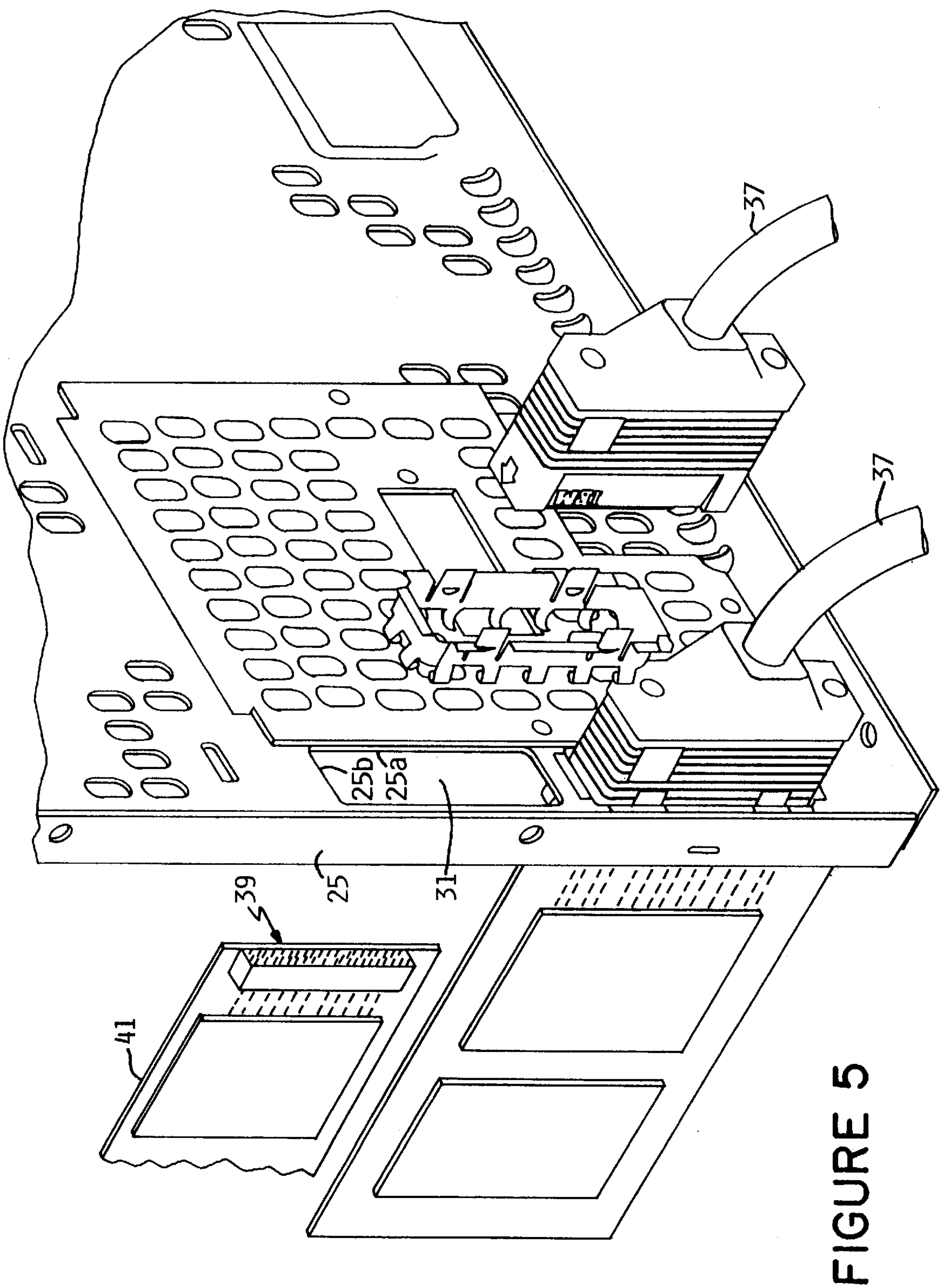
FIG. 5 is a perspective, partially exploded view of a computer frame showing a cable shielded by the shield of FIG. 1.

To further ensure the secure positioning of the shield 11 within an opening 31 (FIG. 5) of the frame 25, the shield 11 is configured such that a distance $X_1$ (FIG. 2) between the lance 27 and the backward-most end of the back extensions 19*a–n* prior to placement of the shield 11 within the frame 25, is greater than the distance $X_2$ (FIG. 4) between the inner surface 25*a* of the frame 25 and the surface of cage 33, e.g., a processor cage) located within the frame opening 31 (FIG. 5). In this manner when the shield 11 is installed within the frame opening 31, the compressed back extensions 19*a–n* are pressed against, i.e., are biased against) the cage 33. The compression of the back extensions 19*a–n* forces the shield 11 forward until the lances 27, and outward biases 23*a–d*, contact the inner surface 25*a* of the frame 25. The shield 11 is thus held firmly in place by the action of the back extensions 19*a–n* and the outward biases 23*a–d*.

To enable the shield 11 to deflect easily when placed within a frame opening, the shield material and its thickness are appropriately tailored based on the size of the frame opening and the distance between the frame 25 and the cage 33. The shield 11 may be designed so that the entire side of the shell 13 deflects when the front extensions 15*a–d* are deflected. This allows flexibility in the placement of the outward biases 23*a–d*. Alternatively, as described below, the shield 11 may be designed so that only the front extensions 15*a–d* substantially deflect.

To facilitate deflection of the front extensions 15*a–d*, a plurality of notches 35 (FIG. 2) are provided, one on each side of each front extension 15. The notches 35 extend into the shell 13 forming elongated front extensions 15*a–d* as shown throughout FIGS. 1–5. Because the front extensions 15*a–d* are elongated into the shell 13, the outward biases 23*a–d* may be advantageously located on the front extensions 15*a–d* and thus may be more easily moved into and out of contact with the frame 25. The elongated front extensions 15*a–d* therefore facilitate installation and removal of the inventive shield 11.

In operation, to place the inventive shield 11 within the frame opening 31 (FIG. 5), a user deflects the front extensions 15*a* and 15*d* inward, e.g., with one hand, and deflects the front extensions 15*b* and 15*c* inward, e.g., with the other hand, such that the outward biases 23*a–d* positioned on the front extensions 15*a–d* clear the inner perimeter of the frame opening 31. The shield 11 is then inserted within the frame opening 31 until the front flanges 17*a–h* contact the outer surface 25*b* of the frame 25. As the shield 11 is inserted within frame opening 31, the back extensions 19*a–n* compress against the cage 33. The curved design of the back extensions 19*a–n* facilitates their compression. Preferably the back extensions 19*a–n* are curved radially outward from the shell 13 and therefore do not reduce the size of the aperture through which a cable must pass.

After the front flanges 17*a–h* contact the outer surface 25*b* of the frame 25, the user releases the front extensions 15*a–d* to allow the outward biases 23*a*–*d* to spring back to their undeflected position. The outward biases 23*a*–*d*, specifically the lances 27 thereof, are thus positioned inward of the frame's inner surface 25*a* and bow outward beyond the inner perimeter of the frame opening 31. The outward biases 23*a*–*d* thus contact the frame 25 to limit forward movement of the shield 11. The backward movement of the shield 11 is limited by the back extensions 19*a*–*n* which are biased against the cage 33 so as to continuously press the shield 11 toward the frame 25. In this manner both the forward and backward movement of the shield 11 is limited. Accordingly the inventive shield 11 is securely held in place, and provides excellent shielding between the frame 25 and the cage 33, such as for shielding a plurality of connector pins located within an opening in the cage, and provides a continuous ground path between the frame 25 and the cage 33. As shown in the exploded view of FIG. 5, a cable 37 passes through the snap-fit shield 11 to connect a plurality of pins 39 of a computer circuit board 41 located within an opening on the cage 33 (FIG. 4). The cable 37 may be, for instance, secured to the cage 33 by thumb-screws (not shown).

To remove the inventive shield 11 from the frame 25 the front extensions 15*a*–*d* are deflected inward so that the outward biases 23*a*–*d* positioned thereon clear the inner perimeter of the frame opening 31. The shield 11 is then lifted from the frame opening 31. The inventive shield 11 is thus quickly and easily snap-fit within, and extracted from, an opening, without requiring the use of screwdrivers or other tools. The snap-fit virtually eliminates movement of the shield 11 once the shield 11 is in place within the frame opening 31, ensuring continuous grounding and shielding. Therefore with use of the inventive shield 11 the negative effects of EMC and ESD are significantly reduced.

Because of its simple design, the inventive shield 11 may be inexpensively manufactured from a single sheet of material. The shield 11 is preferably made of a thin sheet, e.g., 0.005 to 0.010 inches thick, of stainless steel or beryllium copper. Other materials may be similarly employed.

The number of back extensions required to provide adequate shielding depends on the electromagnetic environment to which the shield is exposed. Although the back extensions 19*a*–*n* preferably are compressed against the cage 33 by at least 0.005 inches, the compression amount may vary, as may the outward distance to which the outward biases project, e.g., 0.040 inches.

Accordingly, the foregoing description discloses only the preferred embodiments of the invention. Modifications of the above disclosed apparatus and method which fall within the scope of the invention will be readily apparent to those of ordinary skill in the art. For instance, the outward biases may comprise other mechanisms such as a dart, half moon, or half shear, each of which is well known in the art, and/or may be located anywhere on the shield provided they bias against the inner surface 25*a* of the frame 25. Similarly the back extensions may be straight, angled, curve in other directions, etc. Further, while the inventive shield has been described as snap-fit between a frame and a cage, it will be understood that the inventive shield may be snap-fit between any two surfaces. Accordingly the terms "frame" and "cage" are used herein for clarity and are not limited to a specific structure.

Thus, while the present invention has been disclosed in connection with the preferred embodiments thereof, it should be understood that other embodiments may fall within the spirit and scope of the invention, as defined by the following claims.

The invention claimed is:

1. An electromagnetic shield comprising:
   - a conductive shell having a front perimeter and a back perimeter that define an aperture;
   - a plurality of front extensions extending in a first direction from the front perimeter of the conductive shell;
   - a plurality of back extensions extending from the back perimeter of the conductive shell; and
   - at least one outward bias positioned on the conductive shell;
   - wherein the shield snap-fits within an opening in a frame so as to shield circuitry internal thereto, and wherein a cable may pass through the frame opening which is shielded.

2. The electromagnetic shield of claim 1 further comprising a plurality of front flanges adjacent to the front extensions and extending from the front perimeter of the conductive shell.

3. The electromagnetic shield of claim 2 wherein the plurality of front flanges indicate a desired shield position within the frame opening.

4. The electromagnetic shield of claim 2 wherein the plurality of front flanges extend outward to follow a surface of the frame when inserted therein.

5. The electromagnetic shield of claim 2 wherein the plurality of front flanges are approximately perpendicular to the conductive shell.

6. The electromagnetic shield of claim 2 wherein the plurality of front flanges extend from the front perimeter of the conductive shell in the first direction.

7. The electromagnetic shield of claim 1 wherein the plurality of back extensions are designed to facilitate compression.

8. The electromagnetic shield of claim 7 wherein the plurality of back extensions are curved radially outward.

9. The electromagnetic shield of claim 1 wherein the plurality of front extensions are designed to deflect the shell and to allow the shield to be inserted into and removed from the frame opening.

10. The electromagnetic shield of claim 9 wherein the plurality of front extensions are along opposing sides of the front perimeter of the conductive shell.

11. The electromagnetic shield of claim 1 further comprising a plurality of notches adjacent the plurality of front extensions and extending into the shell so as to form a plurality of elongated front extensions.

12. The electromagnetic shield of claim 11 wherein at least one of the plurality of elongated front extensions comprises the outward bias in a region between the notches.

13. The electromagnetic shield of claim 12 wherein the outward bias comprises a lance.

14. The electromagnetic shield of claim 13 further comprising a plurality of front flanges adjacent to the front extensions and extending outward from the front perimeter of the conductive shell, wherein the lance extends parallel to the frame, wherein the front flanges are configured to extend along the outer surface of the frame and wherein a distance between the back surface of the front flanges and the lance approximately equals the thickness of the frame such that the lance snap-fits along the backside of the frame when the shield is inserted within the frame.

15. The electromagnetic shield of claim 1 wherein the plurality of back extensions are dimensioned to contact a backplate within the frame for creating a ground path between the frame and the backplate.

16. The electromagnetic shield of claim 1 wherein the plurality of back extensions are dimensioned to compressively contact a backplate within the frame so as to bias the shield toward the frame.

17. An electrical machine comprising:

a frame having an opening; and a shield snap-fit within the frame opening so as to shield circuitry internal thereto, the shield having;

a conductive shell having a front perimeter and a back perimeter that define an aperture;

a plurality of front extensions extending in a first direction from the front perimeter of the conductive shell;

a plurality of back extensions extending from the back perimeter of the conductive shell; and at least one outward bias positioned on the conductive shell;

wherein a cable may pass through the frame opening which is shielded.

18. The electrical machine of claim 17, further comprising:

a computer circuit board having input/output pins in line with the frame opening; and a processor cage surrounding the computer circuit board and comprising an opening for exposing the pins, wherein the plurality of back extensions of the shield provide a ground path between the frame and the processor cage.

19. A method for providing electromagnetic shielding between an opening in an electrical equipment cage and a frame surrounding the cage, the frame having an opening approximately aligned with the cage opening, the method comprising:

providing a conductive shield having back extensions and an outward bias, and configured to snap-fit within the opening of the frame, the shield dimensioned to compressively fit between the frame opening and the equipment cage opening;

deflecting at least a portion of the shield;

inserting the shield within the frame opening;

compressing the shield's back extensions against the equipment cage; and releasing the deflected shield to allow the outward bias of the shield to bias against the frame;

wherein the shield is snap-fit in place by the action of the back extensions and the outward bias.

20. The method of claim 19 wherein deflecting at least a portion of the shield comprises deflecting a front extension which operatively couples the outward bias.

21. The method of claim 19 wherein inserting the shield within the frame opening further comprises indicating a desired position of the shield within the frame opening via alignment of a front flange of the shield.

22. An electromagnetic shield designed to snap-fit within an opening in a frame so as to shield circuitry internal thereto, and wherein a cable may pass through the frame opening which is shielded, the shield comprising:

a deflectable shell comprised of a conductive material, having a front perimeter and a back perimeter that define an aperture;

means operatively coupled to the shell for facilitating inward deflection of the shell, means operatively coupled to the shell for contacting a backplate within the frame, and for biasing the shell forward; and means operatively coupled to the shell for biasing against an inner surface of the frame and thereby limiting the forward movement of the shell.

23. The electromagnetic shield of claim 22 further comprising means operatively coupled to the shell for indicating proper positioning of the shell within the frame.

* * * * *